US011363747B2

(12) United States Patent
Tsorng et al.

(10) Patent No.: US 11,363,747 B2
(45) Date of Patent: Jun. 14, 2022

(54) FAN BOARD MODULE FOR A COMPUTER CHASSIS

(71) Applicant: QUANTA COMPUTER INC., Taoyuan (TW)

(72) Inventors: Yaw-Tzorng Tsorng, Taoyuan (TW); Chia-Chun Chen, Taoyuan (TW); Chun Chang, Taoyuan (TW)

(73) Assignee: QUANTA COMPUTER INC., Taoyuan (TW)

(*) Notice: Subject to any disclaimer, the term of this patent is extended or adjusted under 35 U.S.C. 154(b) by 220 days.

(21) Appl. No.: 16/737,580

(22) Filed: Jan. 8, 2020

(65) Prior Publication Data

US 2021/0120710 A1    Apr. 22, 2021

Related U.S. Application Data

(60) Provisional application No. 62/923,010, filed on Oct. 18, 2019.

(51) Int. Cl.
*H05K 7/14* (2006.01)
*F04D 29/60* (2006.01)
*H05K 13/00* (2006.01)
*H05K 13/04* (2006.01)

(52) U.S. Cl.
CPC ....... *H05K 13/0053* (2013.01); *F04D 29/603* (2013.01); *H05K 7/1402* (2013.01); *H05K 13/0015* (2013.01); *H05K 13/0486* (2013.01)

(58) Field of Classification Search
None
See application file for complete search history.

(56) References Cited

U.S. PATENT DOCUMENTS

| | | | | |
|---|---|---|---|---|
| 6,304,443 B1* | 10/2001 | Chou | ............ | G06F 1/20 361/736 |
| 6,515,858 B2* | 2/2003 | Rodriguez | ......... | H05K 7/20909 174/16.3 |
| 6,611,427 B1* | 8/2003 | Liao | ............ | F04D 25/166 312/236 |
| 6,865,078 B1* | 3/2005 | Chang | ............ | H05K 7/20727 361/695 |
| 7,515,413 B1* | 4/2009 | Curtis | ............ | H05K 7/20172 415/213.1 |
| 7,855,886 B1* | 12/2010 | Chen | ............ | H05K 7/20172 361/679.48 |
| 10,765,028 B1* | 9/2020 | Beall | ............ | H05K 7/1489 |
| 2006/0285292 A1* | 12/2006 | Fan | ............ | H05K 7/20172 361/695 |
| 2019/0200481 A1* | 6/2019 | Avvaru | ............ | G11B 33/142 |

* cited by examiner

*Primary Examiner* — Rockshana D Chowdhury
*Assistant Examiner* — Christopher L Augustin
(74) *Attorney, Agent, or Firm* — Nixon Peabody LLP (57) ABSTRACT

A system and method are directed to a fan board sled assembly comprising a fan circuit board including a first end and an opposing second end, a fan cage module including a front section for receiving and removably securing the first end of the fan circuit board to the fan cage module, and a guide bracket including a base section for receiving and removably securing the second end of the fan circuit board to the guide bracket. The fan cage module further includes a back section for receiving one or more fan bodies. The combined fan circuit board, fan cage module and guide bracket are a single integrated unit insertable and extractable from a chassis opening of a computer chassis.

6 Claims, 12 Drawing Sheets

FAN BOARD MODULE FOR A COMPUTER CHASSIS

CROSS-REFERENCE TO RELATED APPLICATION

This application claims priority under 35 U.S.C. § 119 to U.S. Provisional Application No. 62/923,010, entitled "TRIGGER FAN MODULE—TOOL LESS TYPE", filed on Oct. 18, 2019. The contents of that application are hereby incorporated by reference in their entirety.

FIELD OF THE INVENTION

The present invention relates to fan modules. Mom specifically, the present invention relates to fan board modules for a computer chassis.

BACKGROUND

Typically, fan bodies are installed within a computer chassis configuration by sliding the fan body directly into openings in the chassis. During the sliding process the connectors of the fan body typically connect into connectors of a fan board. Fan boards are installed in the chassis where the board is either removed or serviced by opening the chassis cover, which can be an inefficient, time-consuming process.

Accordingly, there is a need for increasing the efficiency of servicing the fan board that minimizes or eliminates removal of the chassis housing to access the fan board and related components.

SUMMARY

According to one embodiment, a fan cage module for securing a plurality of fan bodies to a computer chassis comprises a base having a longitudinal axis extending from a front section to an opposing back section. The front section is configured to receive a removable fan circuit board, and the opposing back section is configured to receive the plurality of fan bodies. The base further includes a first side and an opposing second side that are generally parallel to the longitudinal axis of the base. An elongated first side structure is attached to and extends upwardly from at least a portion of the first side of the base. An elongated second side structure is attached to and extends upwardly from at least a portion of the second side of the base. A fan partition is attached to the base at or near the longitudinal axis of the base. The fan partition has a trigger-style latch assembly coupled thereto by a hinge and a sliding connection. A top cover is disposed above and is connected to one or more of the first side structure, the second side structure, and the fan partition. The top cover includes an aperture that allows a portion of the latch assembly to extend through the top cover to engage the computer chassis.

A further aspect of the embodiment includes the trigger-style latch assembly comprising a spring for nudging the latch assembly into an engaged position such that the portion of the latch assembly extending through the aperture in the top cover is advanced through the aperture to engage the computer chassis during the insertion of the fan cage module into the computer chassis. Another aspect of the embodiment includes the extension of the spring by moving a trigger of the trigger-style latch assembly to cause the portion of the latch assembly extendable through the aperture in the top cover to disengage from the computer chassis, thereby allowing the fan cage module to be extracted from the computer chassis. Still another aspect includes the extension of the spring by moving a trigger of the trigger-style latch assembly to cause the portion of the latch assembly extendable through the aperture in the top cover to disengage from the computer chassis, thereby allowing the fan cage module to be extracted from the computer chassis. Yet another aspect includes receiving a first fan body and a second fan body on the back section of the base, the fan partition being disposed between both of the fan bodies. Another aspect of the embodiment includes a fan board module, and a removable fan circuit board, with the removable fan circuit board secured with a first thumb screw extending through the fan circuit board and into the front section of the base. In one implementation, a guide bracket is separate and distinct from the fan cage assembly, and the guide bracket is secured to the fan circuit board with a second thumb screw extending through the fan circuit board and into a base of the guide bracket.

According to another embodiment, a fan board sled assembly comprises a fan circuit board including a first end and an opposing second end, a fan cage module including a front section for receiving and removably securing the first end of the fan circuit board to the fan cage module, and a guide bracket including a base section for receiving and removably securing the second end of the fan circuit board to the guide bracket. The fan cage module further includes a back section for receiving one or more fan bodies. The combined fan circuit board, fan cage module and guide bracket are a single integrated unit insertable and extractable from a chassis opening of a computer chassis.

A further aspect of the embodiment includes a plurality of fan bodies being removably secured to the fan cage module. In another aspect of the embodiment, the fan cage module includes a latch assembly with a trigger-style handle disposed between two fan bodies. In still another aspect, the trigger-style handle includes a latch at one end that engages and disengages the fan cage module from the computer chassis. In yet another aspect, the trigger-style handle engages and disengages from the computer chassis by pivoting about a hinge connected to the handle and translating via a sliding rivet connected to the handle, the sliding rivet disposed in a slot in a partition secured to the fan cage module. In another aspect of the embodiment, the latch automatically engages the computer chassis during insertion of the fan board sled assembly into the chassis opening. In another aspect of the embodiment, the fan circuit board includes gold finger connectors, and wherein the guide bracket includes a guide pin for allowing the fan board to dock with a socket of another circuit board. In another aspect of the embodiment, the another circuit board is on a different plane from that of the fan board. In another aspect of the embodiment, the fan board is replaceable with another fan board of a different length.

According to yet another embodiment, a method for assembling a fan board module comprises securing a first end of a fan circuit board to a removable guide bracket, securing a second opposing end of the fan circuit board to a removable fan cage module, and sliding the combined guide bracket, fan circuit board, and fan cage module into a computer chassis. The guide bracket and the fan cage module are separate objects. The guide bracket is inserted first and the fan cage module is inserted last into a chassis opening. The fan cage module includes a trigger-style latch mechanism that automatically engages the computer chassis and locks the fan board module to the computer chassis during the sliding step.

A further aspect of the embodiment includes the act of inserting one or more fan bodies into the fan cage module. In another aspect of the embodiment, the latch mechanism is spring operated. In another aspect of the embodiment, the first end of the fan circuit board is secured to the removable guide bracket with a thumb screw. In another aspect of the embodiment, the second end of the fan circuit board is secured to the removable fan cage module with a thumb screw. Another aspect of the embodiment includes actuating the trigger-style latch mechanism to disengage from the computer chassis, thereby allowing the fan board module to be extracted from the chassis opening.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The disclosure will be better understood from the following description of embodiments together with reference to the accompanying drawings.

The present disclosure is susceptible to various modifications and alternative forms. Some representative embodiments have been shown by way of example in the drawings and will be described in detail herein. It should be understood, however, that the invention is not intended to be limited to the particular forms disclosed. Rather, the disclosure is to cover all modifications, equivalents, and alternatives falling within the spirit and scope of the invention as defined by the appended claims.

DETAILED DESCRIPTION

The various embodiments are described with reference to the attached figures, where like reference numerals are used throughout the figures to designate similar or equivalent elements. The figures are not drawn to scale, and they are provided merely to illustrate the instant invention. It should be understood that numerous specific details, relationships, and methods are set forth to provide a full understanding. One having ordinary skill in the relevant art, however, will readily recognize that the various embodiments can be practiced without one or more of the specific details, or with other methods. In other instances, well-known structures or operations are not shown in detail to avoid obscuring certain aspects of the various embodiments. The various embodiments are not limited by the illustrated ordering of acts or events, as some acts may occur in different orders and/or concurrently with other acts or events. Furthermore, not all illustrated acts or events are required to implement a methodology in accordance with the present invention.

Elements and limitations that are disclosed, for example, in the Abstract, Summary, and Detailed Description sections, but not explicitly set forth in the claims, should not be incorporated into the claims, singly, or collectively, by implication, inference, or otherwise. For purposes of the present detailed description, unless specifically disclaimed, the singular includes the plural and vice versa. The word "including" means "including without limitation." Moreover, words of approximation, such as "about," "almost," "substantially," "approximately," and the like, can be used herein to mean "at," "near," or "nearly at," or "within 3-5% of," or "within acceptable manufacturing tolerances," or any logical combination thereof, for example.

With regards to the present disclosure, the terms "computing device" or "computing system" or "computer system" refer to any electronically-powered or battery-powered equipment that has hardware, software, and/or firmware components, where the software and/or firmware components can be configured for operating features on the device. The term "operating environment" can refer to any operating system or environment that functions to allow software to run on a computer system.

It would be desirable to increase the efficiency of servicing fan boards for server and computing systems in a manner that minimizes or eliminates removal of the chassis housing to access the fan board and related components. In accordance with some aspects of the present disclosure, a fan board sled assembly or fan board module is described to include a fan circuit board, a fan cage module, and a guide bracket where these combined features are a single integrated unit insertable and extractable from a chassis opening of a computer chassis without having to remove a chassis housing.

In some aspects, a fan cage module or assembly is contemplated that is a part of the fan board sled assembly. The fan cage module includes a base, with first and second elongated side structures extending upwardly from opposing sides of the base. The base can receive a plurality of fan bodies, and further receive, and have removably secured thereon a fan circuit board. A fan partition with a trigger-style latch assembly is attached to the base. A top cover is disposed on top of the base and is connected to the tops of one or more of the first side structure, the second side structure, and the fan partition. The top cover includes an aperture that allows a portion of the latch assembly to extend through the top cover and engage the computer chassis upon the insertion of a fan board sled into a computer chassis.

A fan board sled or module can include finger connectors (e.g., gold finger connectors) or similar connection devices at one end of the fan board. Such connectors are configured to slide into a midplane board when the fan board sled assembly is inserted into the chassis opening of the computer chassis. The sled assembly includes a front section, such as a fan cage module, and a rear section, such as a guide bracket, that are coupled together by the fan board itself. By this configuration, any length of fan board can be used with the same front and rear sections to create fan board sled assemblies of different lengths, while using the same sized front and rear sections. A rear section of the sled, such as the guide bracket, can include a guide pin that fits into a hole on a midplane board to assist with guiding the finger or comparable connectors, into a socket on the midplane board. The front section of the fan board sled, such as a fan cage assembly or fan cage module, can be arranged to receive two fan bodies, each of which can be secured in place by latching onto the chassis via the fan board sled. The front section can also include a trigger-style handle between the fan bodies for actuating a small latch that secures the fan board sled in place by latching onto the chassis.

Figure 1:
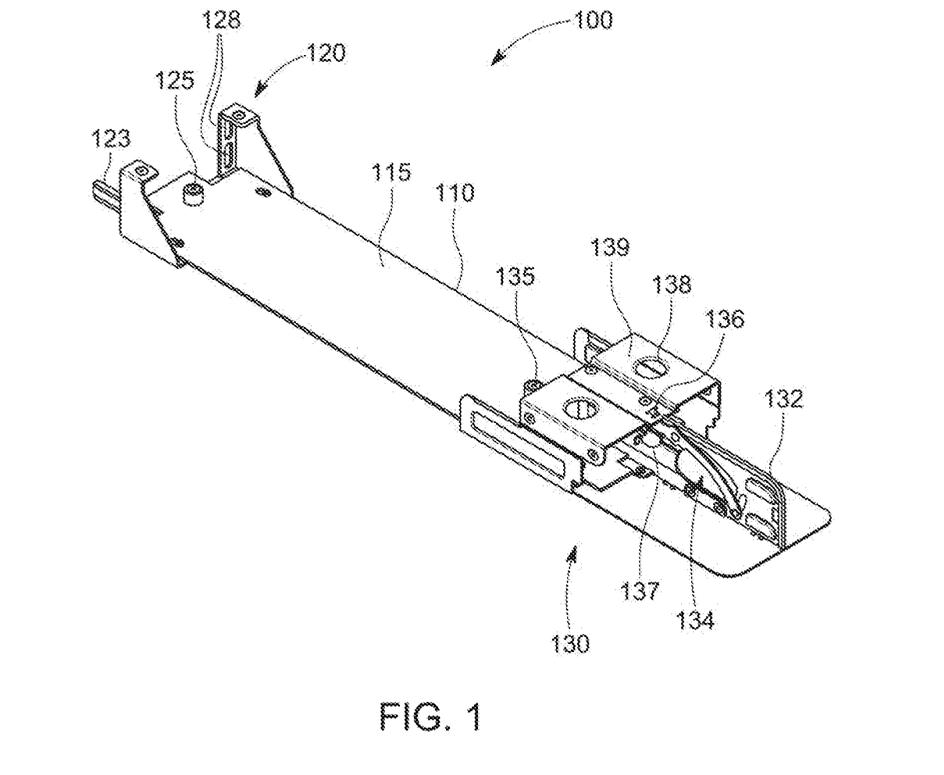
FIG. 1 is an assembled perspective view of an example fan board sled assembly that is insertable into a computer chassis, according to some implementations of the present disclosure.

Referring now to FIG. 1, an assembled perspective view of an example fan board sled assembly 100 is depicted that can be inserted and extracted from a chassis opening of a computer chassis. The fan board sled assembly 100 include a fan board 110 that is generally flat, a guide bracket 120, and a fan cage module 130. One end of the fan board 110 is removably secured to the guide bracket 120 with a fastener 125, such as a thumb screw, that can firmly secure the fan board 110 to the guide bracket 120, yet can also allow for easy separation of the fan board 110 from the guide bracket 120 without the need for separate tools. Similarly, the other end of the fan board 110 is removably secured to the fan cage module 130 with another fastener 135, such as another thumb screw, that can also firmly secure the fan board 110 to the fan cage module 130, yet similarly allow for easy separation of the fan board 110 from the fan cage module 130. These features are desirable because they further allow the fan board sled assembly 100, with its guide bracket 120 and fan cage module 130 to accommodate fan boards of different lengths thus providing for versatile arrangements for different computer configurations.

Other desirable aspects of the fan board sled assembly 100 include a guide pin 123 that is a part of or fastened to the guide bracket 120. The guide pin 123 allows the fan board 110 to dock or otherwise physically interface with a socket of another circuit board (not shown), especially where the other circuit board is not in the same plane as the fan circuit board 110, but instead is on a different plane or perpendicular to the primary flat surface 115 of the fan board 110. In some aspects, the guide bracket 120 may further include one or more vent holes 128 within its structural member(s) to allow airflow within the computer chassis to minimize overheating of computer components. Similar vent holes are also contemplated for the fan cage module 130 such as vent hole 138.

The fan cage module 130 of the fan board sled assembly 100 can also include a fan partition 132, with a trigger-style latch assembly 134 having a latch portion 136 that extends through a top cover 139 of the fan cage module 130. The latch portion may extend into the top cover due to a force applied to trigger-style latch assembly by a spring 137, as described for example for the aspects depicted in FIGS. 7A and 7B.

Figure 2A:
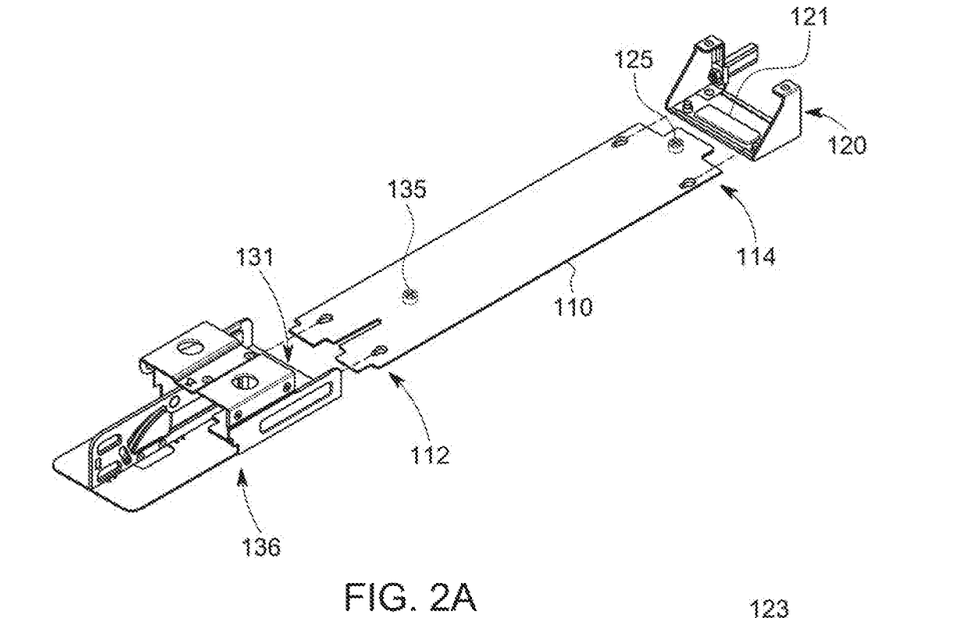
FIG. 2A is a partially exploded perspective view of the fan board sled assembly in FIG. 1.
Figure 2B:
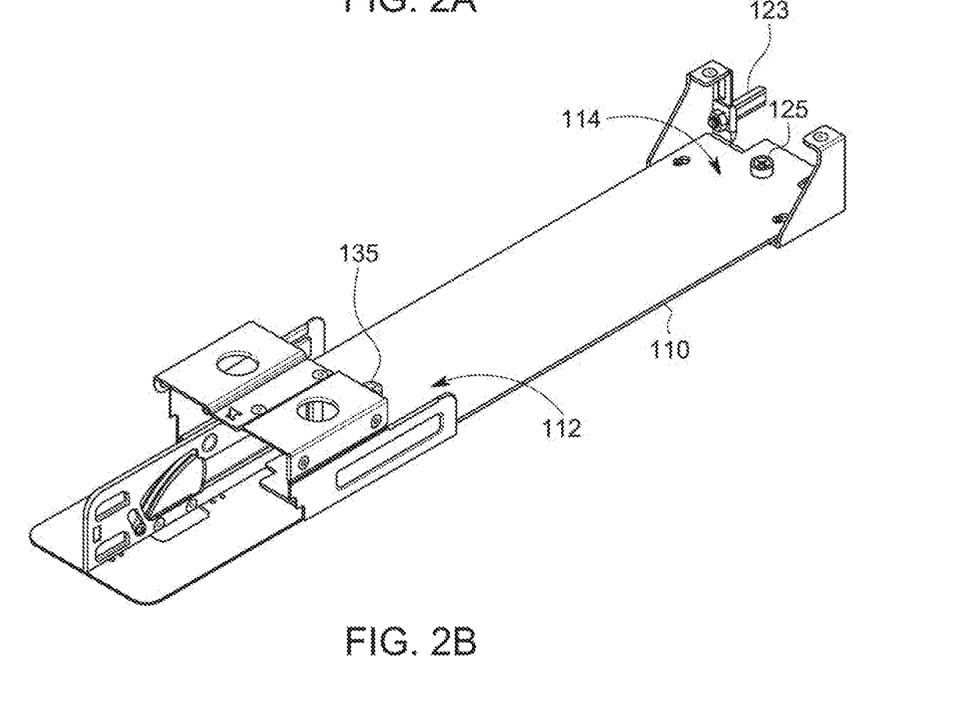
FIG. 2B is another assembled perspective view of the fan board sled assembly in FIG. 1.

Referring now to FIG. 2A, a partially exploded perspective view of the example fan board sled assembly 100 in FIG. 1 is illustrated. As depicted, a fan circuit board 110 is disposed between a guide bracket 120 and a fan cage module 130 (see FIG. 1). The fan circuit board 110 includes a first end 112 and an opposing second end 114. A front section 131 of the fan cage module 130 receives the first end 112 which can be removably secured with a thumb screw 135, or other fastening system that allows for the fan board 110 to be readily fastened and unfastened from the fan cage module 130 without the need for any separate tools. Similarly, a base section 121 of the guide bracket 120 receives the second end 114 which can be removably secured with another thumb screw 125, or other fastening system to similarly allow for the fan board 110 to be readily fastened and unfastened from the guide bracket 120. An alternate assembled perspective view of the fan board sled assembly in FIGS. 1 and 2A is depicted in FIG. 2B. FIG. 2B provides an alternate perspective view with additional details of the guide pin 123, including that the pin 123 may be raised or lowered and secured in place to accommodate different configurations of a second circuit board (not shown) to which the fan board 110 may be connected, such as though a finger connection on the fan board 110 to a socket on the second circuit board.

Figure 3A:
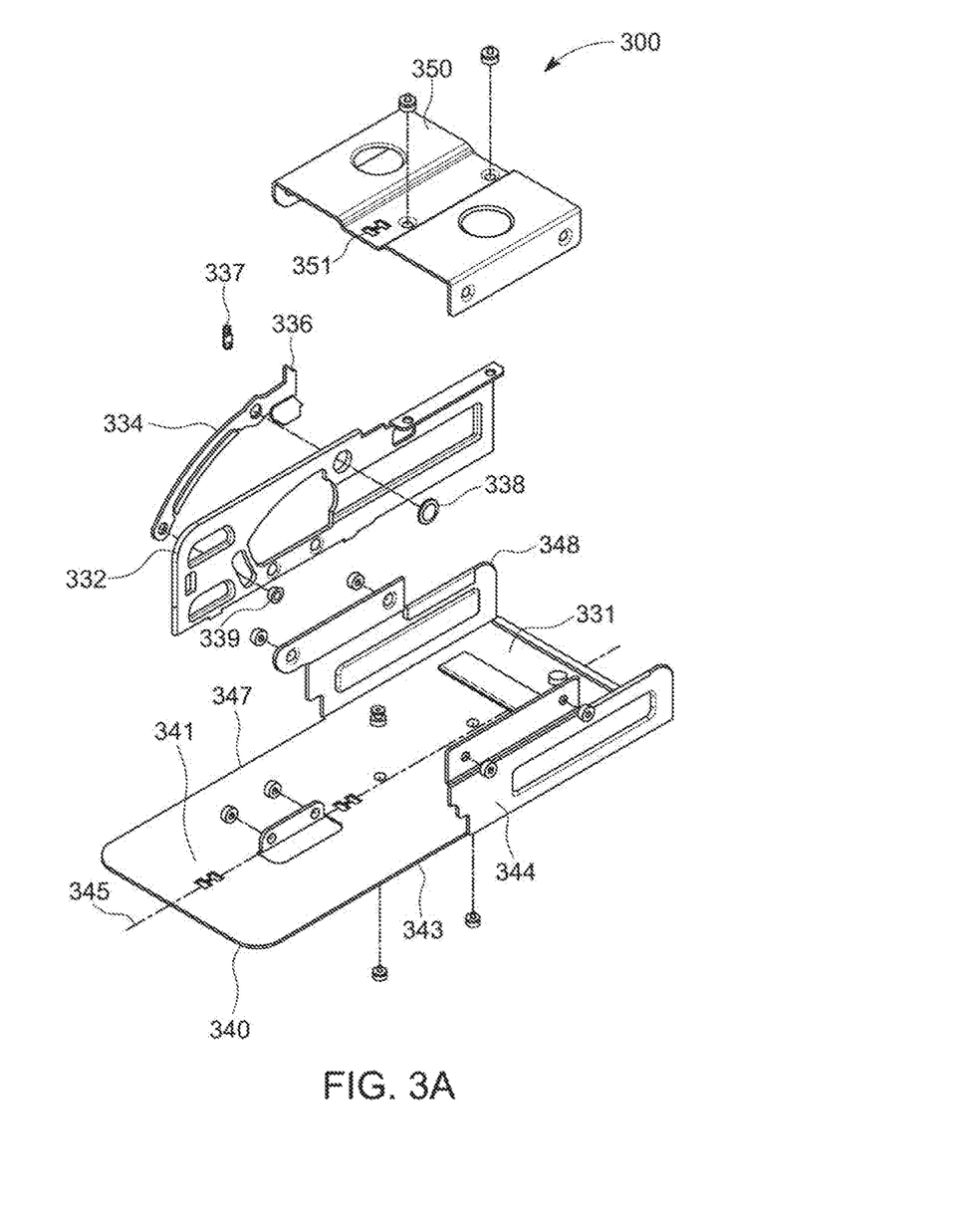
FIG. 3A is an exploded perspective view of the fan cage module of the trigger-lock fan module in FIG. 1.
Figure 3B:
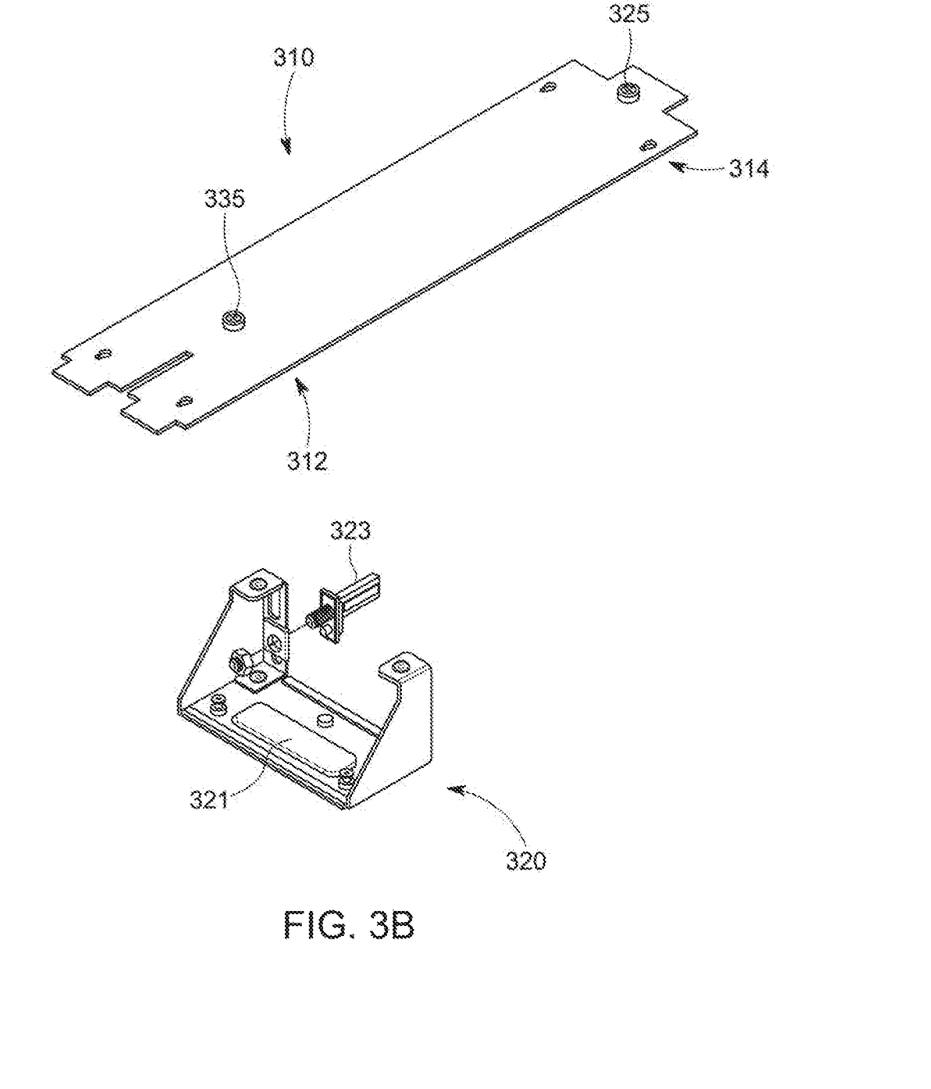
FIG. 3B is an exploded perspective view of the fan board and guiding bracket mechanisms of the trigger-lock fan module in FIG. 1.

Referring now to FIGS. 3A and 3B, an exploded perspective view of the fan cage module, fan circuit board, and guide bracket are depicted of the fan board sled assembly in FIG. 1. A fan cage module 300 can include a base 340 having a longitudinal axis 345 extending from a front section 331 to an opposing back section 341. The front section 331 receives a removable fan circuit board 310, and the opposing back section 341 receives a plurality of fan bodies (illustrated in FIG. 4C). The base 340 further includes a first side 343 and an opposing second side 347 that are generally parallel to the longitudinal axis 345 of the base 340. An elongated first side structure 344 is attached to and extends upwardly from at least a portion of the first side 343 of the base 340. An elongated second side structure 348 is attached to and extends upwardly from at least a portion of the second side 347 of the base 340. A fan partition 332 is attached to the base 340 at or near the longitudinal axis 345 of the base 340. The fan partition 332 can have a trigger-style latch assembly 334 that is coupled to the fan partition 332 by, for example, a hinge 338 and a sliding connection 339, both being secured to the body of the fan partition 332. A top cover 350 is disposed above and is connected to one or more of the first side structure 344, the second side structure 348, and the fan partition 332. The top cover 350 includes an aperture 351 that allows a portion 336 of the latch assembly 334 to extend through the top cover 350 to engage a computer chassis.

In some aspects, the fan cage module 300 can include a trigger-style latch 334 that includes a spring 337 for nudging the latch 334 into an engaged position. In the engaged position, the portion 336 of the latch extending through the aperture 351 in the top cover 350 is advanced through the aperture 351 to engage a computer chassis during the insertion of the fan cage module 300 into the computer chassis. It is further contemplated that a compression of the spring 337 by moving the trigger-style latch 334 about the hinge causes the portion 336 of the latch 334, that is extendable through the aperture 351 in the top cover 350, to disengage from the computer chassis, thereby allowing the fan cage module 300 to be extracted from the computer chassis.

In some aspects, a fan cage module 300 may be a part of a fan board module, similar to a fan board sled assembly, and can be inserted and extracted from a chassis opening in a computer chassis. The fan board module can further include a removable fan circuit board 310. The removable fan circuit board 310 may be secured with a first thumb screw 335 extending through the fan circuit board 310 and into the front section 331 of the base 340. A guide bracket 320 may also be a part of the fan board module and be separate and distinct from the fan cage module 300. The guide bracket 320 may be secured to the fan circuit board 310 with a second thumb screw 325 extending through the fan circuit board 310 and into a base 321 of the guide bracket 320. Another aspect of a guide pin 323 is also illustrated that is secured via a nut or other fastener to the guide bracket 320.

Figure 4A:
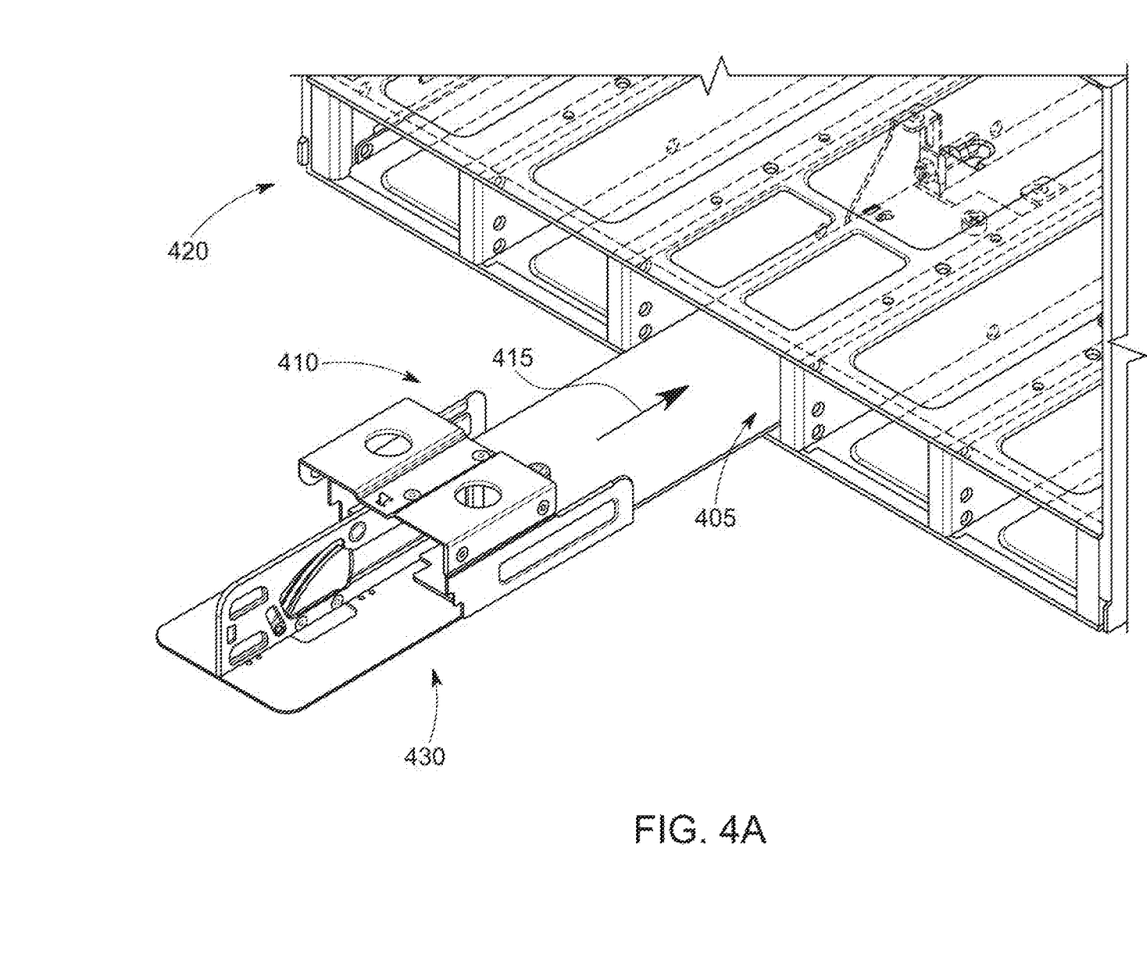
FIG. 4A is a perspective view depicting the insertion of the fan board sled assembly of FIG. 1 into a computer chassis, according to some implementations of the present disclosure.

Referring now to FIG. 4A, a perspective view depicting the insertion of the fan board sled assembly of FIG. 1 into a chassis opening 405 of a computer chassis 420 is illustrated. The assembled fan board sled assembly 410 is similar to other embodiments disclosed herein, and includes a fan circuit board secured to a removable guide bracket with the same fan circuit board secured at another end to a removable fan cage module 430. The fan sled board assembly 410 is slid or otherwise inserted into the chassis opening 405 in the direction of arrow 415, such that the combined guide bracket, fan circuit board, and fan cage module 430 are placed into a computer chassis with the guide bracket being inserted first and the fan cage module 430 being inserted last, into the chassis opening 405. In some aspects, the fan cage module 430 includes a trigger-style latch mechanism that automatically engages the computer chassis 420 and locks the fan board module 410 to the computer chassis 420.

Figure 4B:
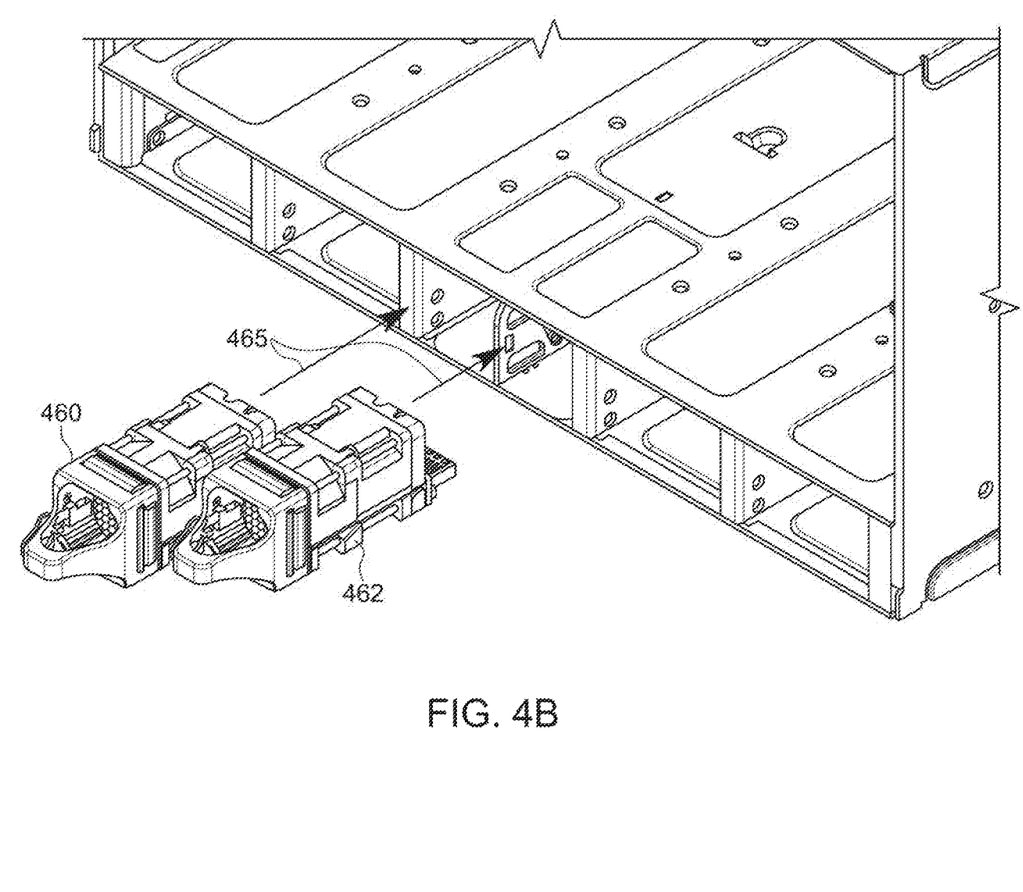
FIGS. 4B and 4C depict the insertion of fan bodies into the fan cage of the example fan board sled assembly depicted in FIG. 4A that is inserted into a computer chassis, according to some implementations of the present disclosure.
Figure 4C:
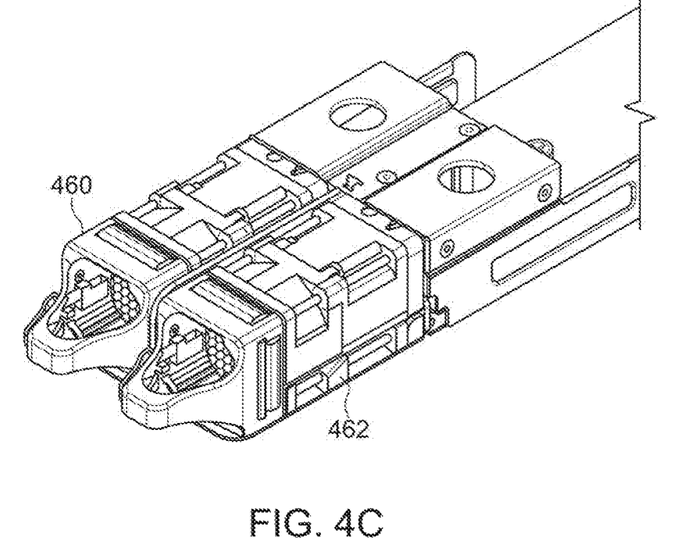

Referring now to FIGS. 4B and 4C, fan bodies 460, 462 are inserted into the fan cage module 430 of the fan board sled assembly 410 depicted in FIG. 4A. The fan bodies 460, 462 are inserted in the direction of arrows 465 into the chassis opening 405. FIG. 4C illustrates an aspect of the fan bodies 460, 462 positioned in the fan board sled assembly 410 after insertion with the fan bodies 460, 462 connected to the fan cage module 430. A fan body can include one or more connectors for power and fan control, along with a housing for the fan. The housing may include a motor that rotates a fan according to the control signal(s). The fan can be used for active cooling of the computer during computer operations by drawings cooler air into the computer housing, expelling warm air, or moving air across a heat sink to cool a particular component.

Figure 5:
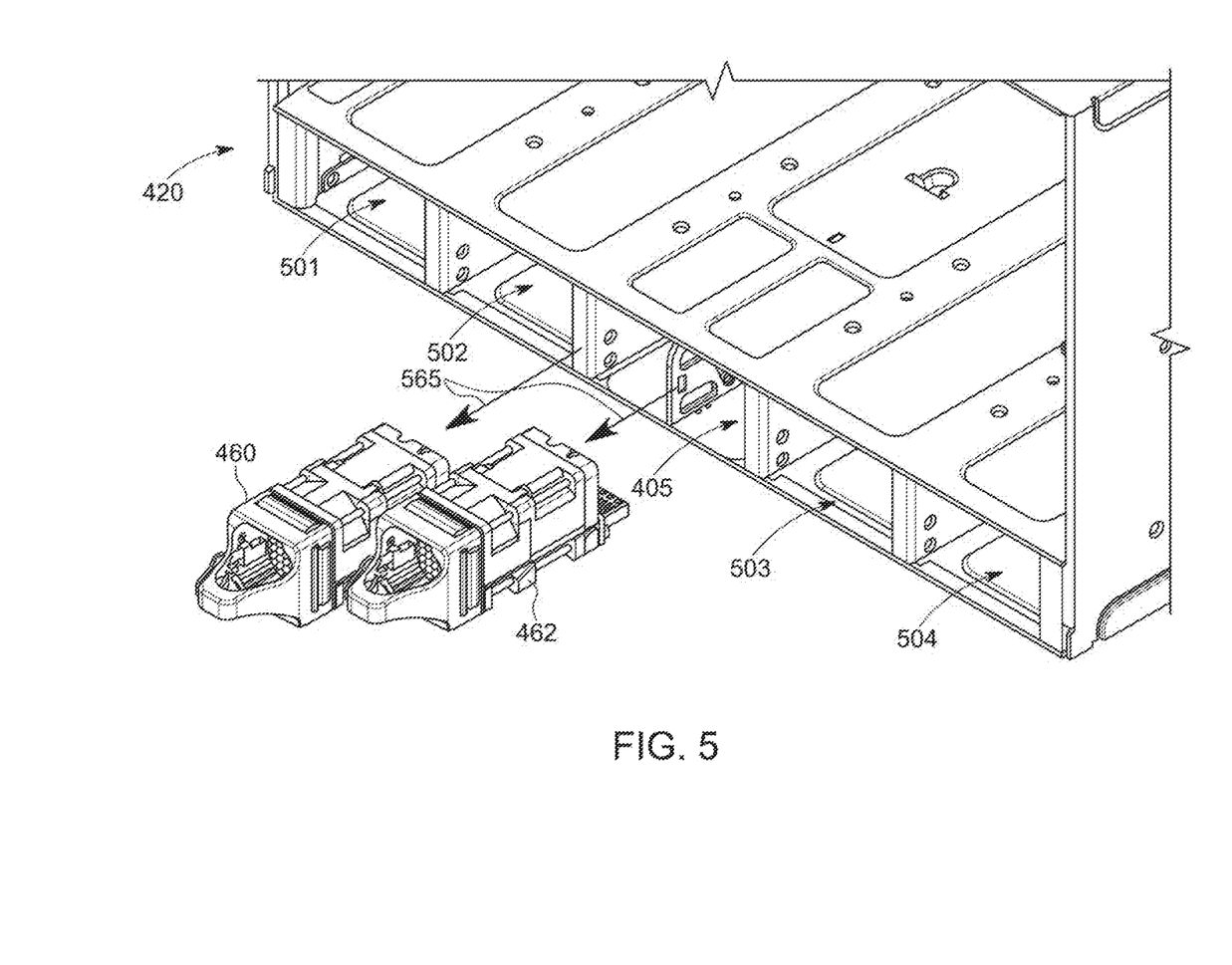
FIG. 5 depict the removal of the fan bodies from the fan cage of the example fan board sled assembly of FIG. 1, according to some implementations of the present disclosure.
Figure 8:
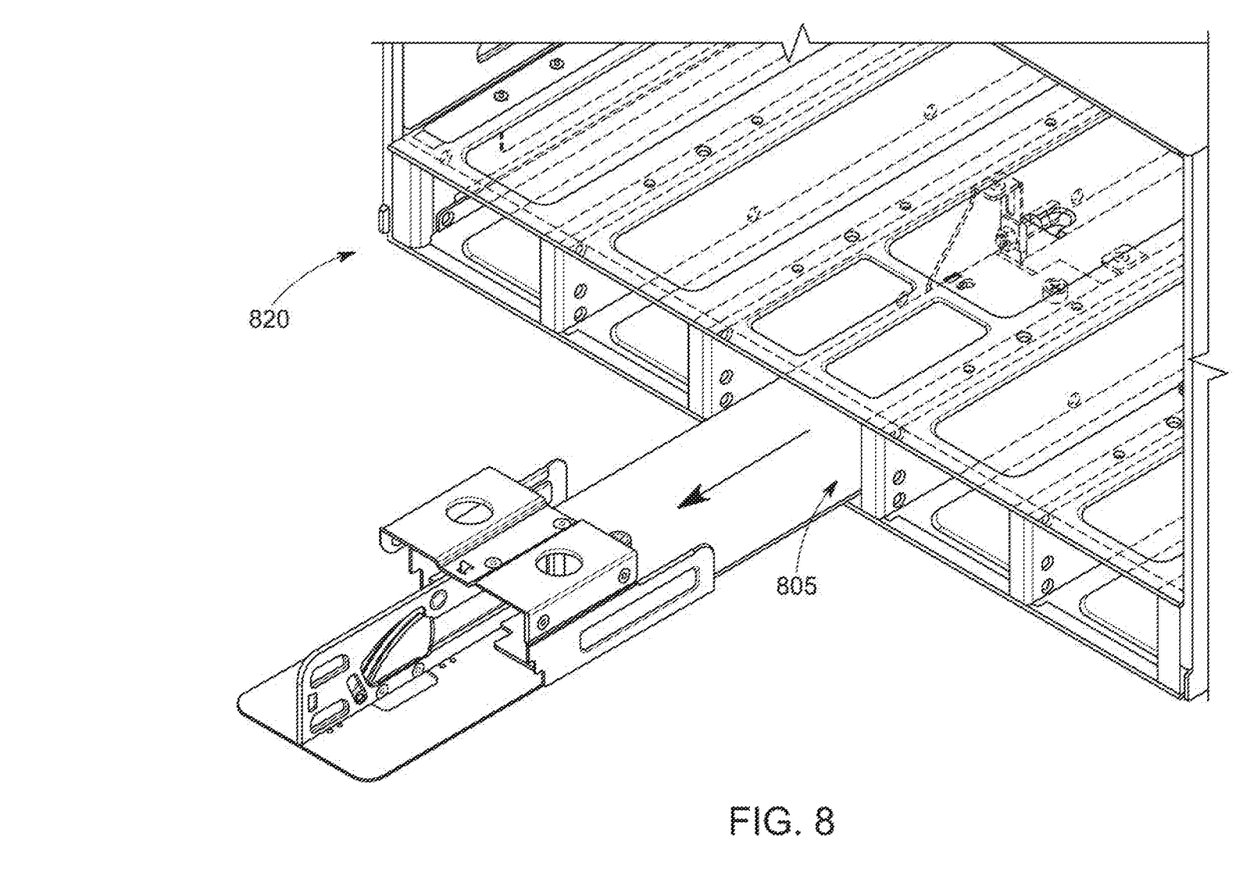
FIG. 8 depicts removal of a disengaged fan board sled assembly from a computer chassis, according to some implementations of the present disclosure.

Referring now to FIG. 5, the removal of the fan bodies 460, 462 from the fan cage module 430 of the fan board sled assembly of FIG. 4A is depicted. The fan bodies 460, 462 are removed from the chassis opening in direction 565, which is the opposite of direction 465 illustrated in FIG. 4B. Following removal of the fan bodies 460, 462, the fan board sled module can then be also extracted through the chassis opening 405 of the computer chassis 420 via the latch assembly. FIG. 5, similar to FIGS. 4A, 4B, and 8, illustrates a plurality of chassis openings similar to chassis opening 405. It is contemplated that these other chassis openings, such as chassis openings 501, 502, 503, 504, can be used for other boards, such as a power supply unit board, another fan board, or other computer components. A computer chassis can include varying numbers of chassis openings for the insertion and extraction of computer components.

Figure 6:
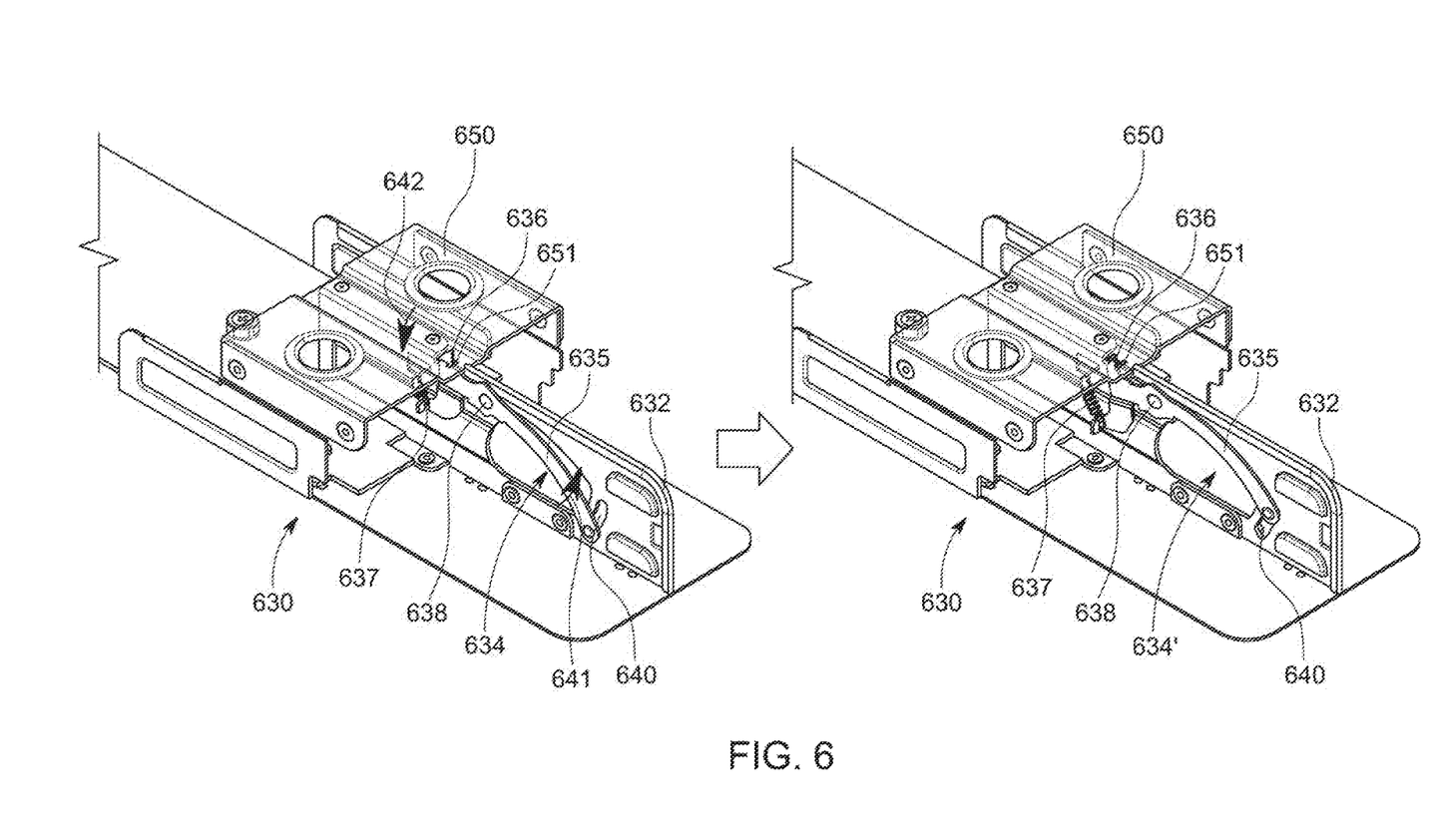
FIG. 6 depicts activation of a trigger-style latch assembly of the fan cage module from an engaged to a disengaged position, according to some implementations of the present disclosure.

Referring now to FIG. 6, activation of a trigger-style latch assembly disposed on the fan cage module 630 from an engaged to a disengaged position is illustrated to facilitate the removal of the fan board sled assembly from the computer chassis via a chassis opening. An aspect of the trigger-style latch assembly in an engaged position is illustrated by a first position of trigger-latch assembly 634. The latch assembly 634 is then rotated, as demonstrated by arrows 641, 642 about a hinge 638 until that latch assembly 634 is in the second disengaged position, as illustrated by trigger-latch assembly 634'. The trigger-style latch assembly 634 includes a latch 635 that is connected to the fan partition 632 at a hinge 638, and along a sliding connection 639 in a slot 640 that is disposed in the fan partition 632. In an engaged position, a portion 636 of the latch 635 at a first end extends through an aperture 651 in a top cover 650 of the fan cage module 630 and engages the computer chassis to lock the fan board sled assembly into the computer chassis. The portion 636 of latch 635 at the first end is urged via a spring 637 that pushes the portion 636 of the latch 635 at the first end in an upward direction. With the latch assembly 634 in the engaged position, an opposite end of the latch 635 can then be translated upwardly along the slot 640, which in turn translates the first end of the latch 635 in a downward direction that disengages the portion 636 of the latch from the computer chassis and allows the disengaged fan cage module, and thus the combined fan board sled assembly, to easily be removed as a single unit through the chassis opening 805 of a computer chassis 820, as illustrated in FIG. 8.

Figure 7A:
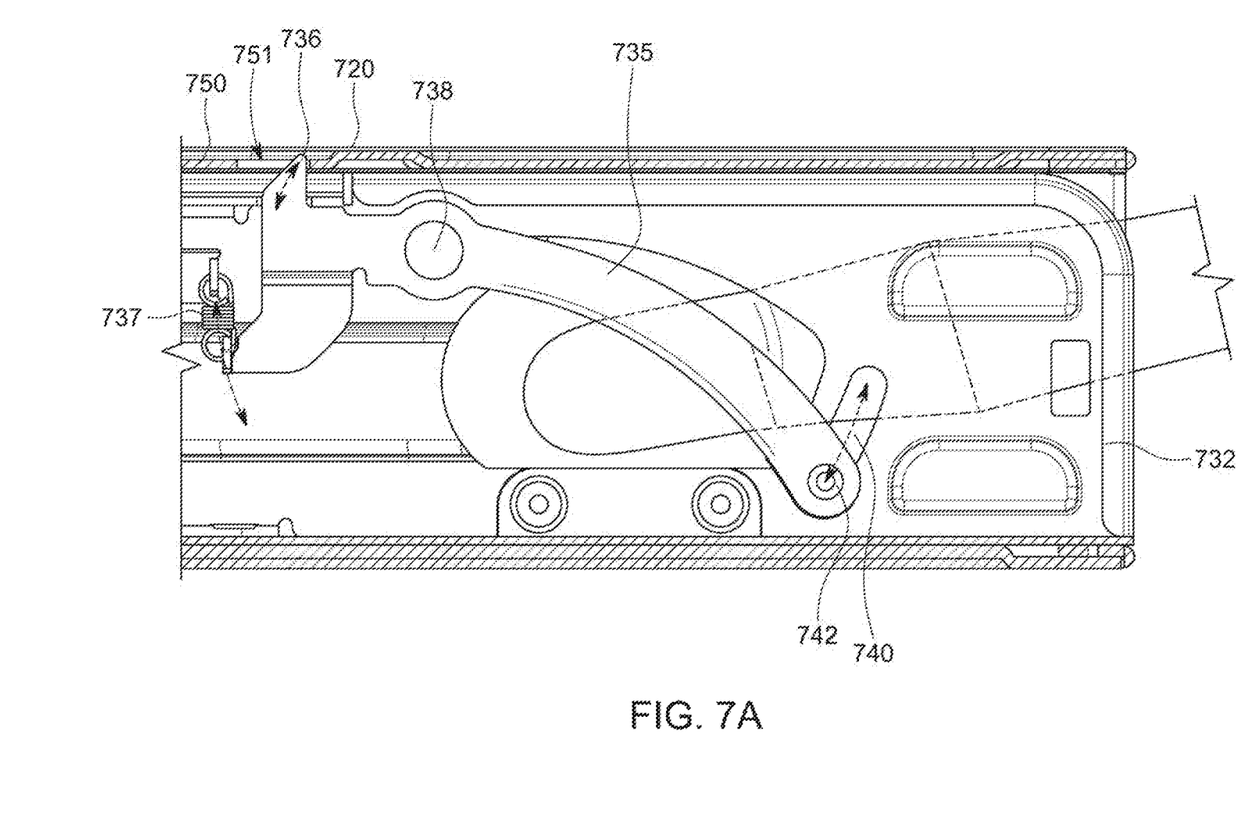
FIGS. 7A and 7B depict a detailed view of the activation of the trigger-style latch assembly in FIG. 6 that is disposed on a fan partition of the fan cage module, according to some implementations of the present disclosure.
Figure 7B:
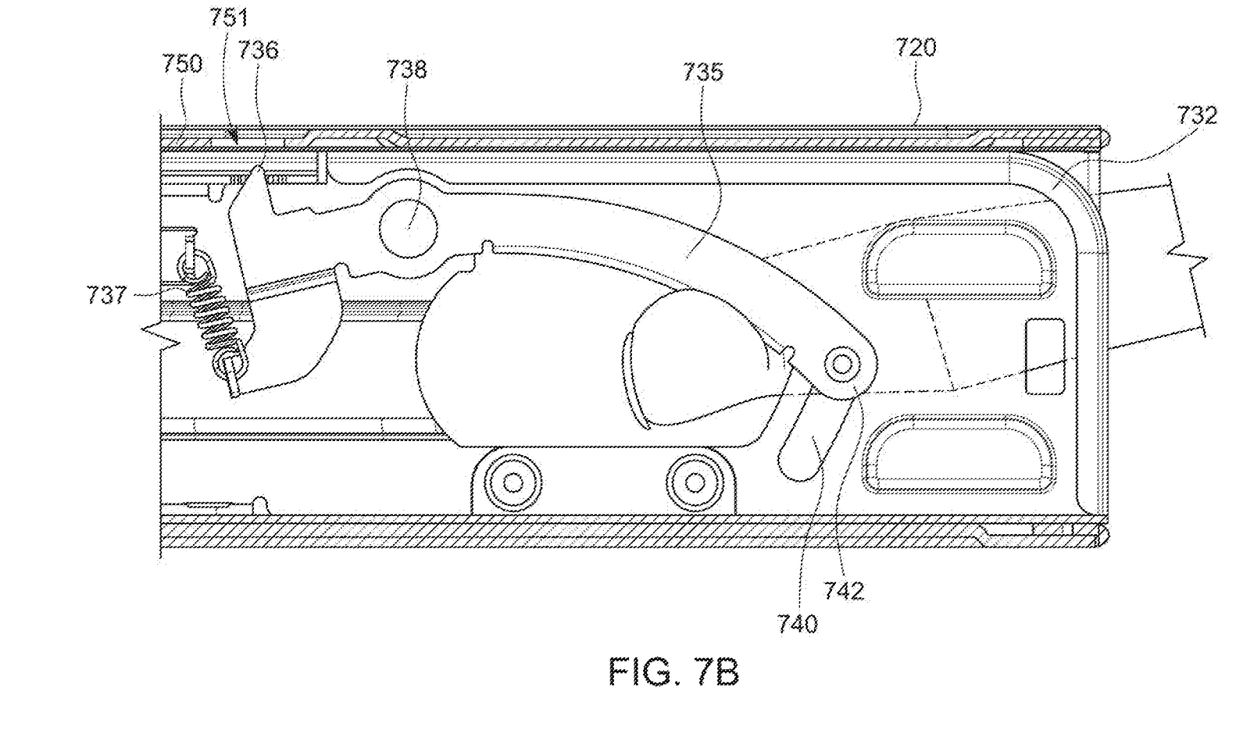

FIGS. 7A and 7B provides a detailed view of the activation of the trigger-style latch assembly that is depicted in FIG. 6. FIG. 7A depicts the trigger-style latch assembly in an engaged position where a portion 736 of the latch 735 extends through the aperture 751 in the top cover 750 of the fan cage module, and engages the computer chassis 720 to lock the fan board sled assembly into the computer chassis 720, as part of the fan board sled being inserted into the chassis opening. The portion 736 of latch 735 at the first end is urged upwardly via a spring 737 that pushes the portion 736 of the latch 735 at the first end in the upward direction about the hinge 738. With the trigger-style latch assembly in the engaged position as shown in FIG. 7A, the disengagement process is illustrated in FIG. 7B. An opposite end 742 of the latch 735 is now translated upwardly along slot 740, which in turn translates the first end of the latch 735 in a downward direction to disengage the portion 736 of the latch from the computer chassis 720 while depressing the spring 737. While other aspects of removably securing a fan board sled assembly in a computer chassis are contemplated, the trigger-style latch assembly secured to the fan partition 732 is a desirable aspect for performing this operation. For example, the one-touch surface of the latch (e.g., the trigger) is user friendly. Furthermore, the use of a spring 737 provides feedback to the user as the portion 736 of the latch disengages from the computer chassis 720 while also urging the same portion 736 of the latch in an upward direction during insertion of the fan board assembly into the chassis opening.

While various embodiments of the present invention have been described above, it should be understood that they have been presented by way of example only, and not limitation. Numerous changes to the disclosed embodiments can be made in accordance with the disclosure herein without departing from the spirit or scope. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations, and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting. As used herein, the singular forms "a," "an," and "the" are intended to include the plural forms as well, unless the context clearly indicates otherwise. Furthermore, to the extent that the terms "including," "includes," "having," "has," "with," or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. Furthermore, terms, such as those defined in commonly used dictionaries, should be interpreted as having a meaning that is consistent with their meaning in the context of the relevant art and will not be interpreted in an idealized or overly formal sense unless expressly so defined herein.

What is claimed is:

1. A fan cage module for securing a plurality of fan bodies to a computer chassis, the fan cage module comprising:
   a base having a longitudinal axis extending from a front section to an opposing back section, the front section configured to receive a removable fan circuit board and the opposing back section configured to receive the plurality of fan bodies, the base further including a first side and an opposing second side that are generally parallel to the longitudinal axis of the base;
   an elongated first side structure attached to and extending upwardly from at least a portion of the first side of the base;
   an elongated second side structure attached to and extending upwardly from at least a portion of the second side of the base;
   a fan partition attached to the base at or near the longitudinal axis of the base, the fan partition having a trigger-style latch assembly coupled thereto by a hinge and a sliding connection; and
   a top cover disposed above and connected to one or more of the first side structure, the second side structure, and the fan partition, the top cover including an aperture that allows a portion of the latch assembly to extend through the top cover to engage the computer chassis.

2. The fan cage module of claim 1, wherein the trigger-style latch assembly includes a spring for nudging the latch assembly into an engaged position such that the portion of the latch assembly extending through the aperture in the top cover is advanced through the aperture to engage the computer chassis during the insertion of the fan cage module into the computer chassis.

3. The fan cage assembly of claim 2, wherein extension of the spring by moving a trigger of the trigger-style latch assembly causes the portion of the latch assembly extendable through the aperture in the top cover to disengage from the computer chassis, thereby allowing the fan cage module to be extracted from the computer chassis.

4. The fan cage module of claim 1, further comprising receiving a first fan body and a second fan body on the back section of the base, the fan partition being disposed between both of the fan bodies.

5. A fan board module comprising:
   the fan cage module of claim 1; and
   a removable fan circuit board, wherein the removable fan circuit board is secured with a first thumb screw extending through the fan circuit board and into the front section of the base.

6. The trigger fan module of claim 5, further comprising a guide bracket separate and distinct from the fan cage assembly, wherein the guide bracket is secured to the fan circuit board with a second thumb screw extending through the fan circuit board and into a base of the guide bracket.

* * * * *